United States Patent
Xu

(10) Patent No.: US 8,350,356 B2
(45) Date of Patent: Jan. 8, 2013

(54) ANTI-FUSE BASED PROGRAMMABLE SERIAL NUMBER GENERATOR

(75) Inventor: Daniel Xu, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 12/979,265

(22) Filed: Dec. 27, 2010

(65) Prior Publication Data
US 2012/0061765 A1 Mar. 15, 2012

(30) Foreign Application Priority Data
Dec. 29, 2009 (CN) .......................... 2009 1 0247496

(51) Int. Cl.
*H01L 27/06* (2006.01)

(52) U.S. Cl. .................. 257/530; 257/50; 257/E27.014; 257/E27.018

(58) Field of Classification Search ..................... 257/50, 257/530, E27.014, E27.018
See application file for complete search history.

(56) References Cited

U.S. PATENT DOCUMENTS

| | | | |
|---|---|---|---|
| 5,774,011 A | 6/1998 | Au et al. | |
| 6,087,707 A * | 7/2000 | Lee et al. | 257/530 |
| 6,686,791 B2 * | 2/2004 | Zheng et al. | 327/525 |
| 2006/0092742 A1 * | 5/2006 | Paillet et al. | 365/225.7 |
| 2006/0231922 A1 * | 10/2006 | Marr et al. | 257/530 |
| 2011/0108926 A1 * | 5/2011 | Bahl | 257/379 |

* cited by examiner

*Primary Examiner* — Victor A Mandala
(74) *Attorney, Agent, or Firm* — Kilpatrick Townsend & Stockton LLP

(57) ABSTRACT

An anti-fuse apparatus includes a substrate of a first conductivity type and a well region of a second conductivity type formed in the substrate. A junction between the well region and the substrate is characterized by a breakdown voltage higher than a predetermined voltage. The apparatus includes a contact region of the second conductivity type within the well region. The apparatus also includes a channel region and a drain region within the substrate. A gate dielectric layer overlies the channel region and the contact region. A first polysilicon gate, the drain region, and the well region are associated with an MOS transistor. The apparatus also includes a second polysilicon gate overlying the gate dielectric layer which overlies the contact region. The contact region is configured to receive a first supply voltage and the second polysilicon gate is configured to receive a second supply voltage.

14 Claims, 3 Drawing Sheets

ANTI-FUSE BASED PROGRAMMABLE SERIAL NUMBER GENERATOR

CROSS-REFERENCES TO RELATED APPLICATIONS

This application claims priority to Chinese Patent Application No. 200910247496.1, filed Dec. 29, 2009, which is commonly owned and incorporated by reference herein for all purposes.

BACKGROUND OF THE INVENTION

Embodiments of the present invention relate to integrated circuits and the processing for the manufacture of semiconductor devices. More particularly, embodiments of the present invention provide a method and structure for an anti-fuse based non-volatile memory device. Merely by way of example, the present invention provides a method and device for an anti-fuse based programmable serial number generator using conventional CMOS logic process. But it would be recognized that the invention has a much broader range of applicability.

Integrated circuits or "ICs" have evolved from a handful of interconnected devices fabricated on a single chip of silicon to millions of devices. Current ICs provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of ICs. Semiconductor devices are now being fabricated with features less than a quarter of a micron across.

Increasing circuit density has not only improved the complexity and performance of ICs but has also provided lower cost parts to the consumer. An IC fabrication facility can cost hundreds of millions, or even billions, of dollars. Each fabrication facility will have a certain throughput of wafers, and each wafer will have a certain number of ICs on it. Therefore, by making the individual devices of an IC smaller, more devices may be fabricated on each wafer, thus increasing the output of the fabrication facility. Making devices smaller is very challenging, as each process used in IC fabrication has a limit. That is to say, a given process typically only works down to a certain feature size, and then either the process or the device layout needs to be changed. An example of such a limit is embedded non-volatile memory device used for the manufacture of integrated circuits in a cost effective and efficient way.

Fabrication of custom integrated circuits using chip foundry services has evolved over the years. Fabless chip companies often design the custom integrated circuits. Such custom integrated circuits require a set of custom masks commonly called "reticles" to be manufactured. A chip foundry company called Semiconductor Manufacturing International Corporation (SMIC) of Shanghai, China is an example of a chip company that performs foundry services. Although fabless chip companies and foundry services have increased through the years, many limitations still exist. For example, it is often desirable to incorporate a serial number in an integrated circuit as a security feature. This feature is typically realized using non-volatile memory cells, such as a flash cell. However, it can be expensive to implement this feature in a conventional logic process, such as a CMOS logic process, because new process steps and circuits will be required for high voltage devices and on-chip charge pumps. Alternatives, such as laser fuse devices, are also expensive, because they often require substantial process modification and external equipment, such as a laser writer. These and other limitations are described throughout the present specification and more particularly below.

From the above, it is seen that an improved technique and structure for processing and programming of non-volatile memory devices is desired.

BRIEF SUMMARY OF THE INVENTION

Embodiments of the present invention provide techniques and structures for fabricating integrated circuit devices. More particularly, embodiments of the present invention provide a method and structure for an anti-fuse based non-volatile memory device. Merely by way of example, the present invention provides a method and device for an anti-fuse based programmable serial number generator using conventional CMOS logic process. But it would be recognized that the invention has a much broader range of applicability. Depending upon the embodiment, the present invention includes various features, which may be used.

A specific embodiment of the present the invention provides an integrated circuit device. The device includes a semiconductor substrate which is characterized by a first conductivity type. The device includes a well region within the semiconductor substrate. The well region is characterized by a second conductivity type. A junction between the well region and the substrate is characterized by a breakdown voltage higher than a predetermined voltage. The device also includes a number of isolation regions. The device further includes a contact region within the well region. The contact region is characterized by the second conductivity type. The contact region is configured to receive a first supply voltage. The device includes a channel region within the substrate. A drain region of the second conductivity type is separated from the well region by the channel region. The device also includes a gate dielectric layer overlying the channel region and the contact region. A first polysilicon gate overlies the gate dielectric layer which overlies the channel region. An edge of the first polysilicon gate overlies a portion of the well region. The first polysilicon gate, the drain region, and the well region form a gate region, a drain region, and a source region, respectively, of an MOS transistor. The device also includes a second polysilicon gate overlying the gate dielectric layer which overlies the contact region. The second polysilicon gate is configured to receive a second supply voltage.

In a specific embodiment, the first conductivity type is P-type and the second conductivity type is N-type. In an alternative embodiment, the first conductivity type is N-type, the second conductivity type is P-type, and the first supply voltage is lower than the second supply voltage. In an embodiment, the well region is characterized by a depth of more than 1 um. In another embodiment the well region is characterized by a depth of more than 0.5 um. In a specific embodiment, the predetermined voltage is higher than a breakdown voltage of the gate dielectric. In an embodiment, the predetermined voltage is about 10-15 volts. In a specific embodiment, a voltage difference between the first supply voltage and the second supply voltage is greater than a breakdown voltage of the gate dielectric.

In an alternative embodiment, the invention provides an integrated circuit apparatus. The apparatus includes a semiconductor substrate including a surface region. The substrate is characterized by a first conductivity type. The apparatus includes three well regions within the semiconductor substrate. The first well region is characterized by a second conductivity type. The second well region is characterized by the second conductivity type. A junction between the second well region and the substrate is characterized by a breakdown voltage higher than a predetermined voltage. The third well region is characterized by the first conductivity type. The apparatus includes a plurality of isolation regions. The apparatus also includes a gate dielectric layer overlying the surface region overlying the substrate, the first well region, second well region, and the third well region. The apparatus further includes a first MOS transistor which includes a drain region and a source region within the third well region, and a first gate overlying the gate dielectric. The apparatus also includes a second MOS transistor which includes a drain region and a source region within the first well region and a second gate overlying the gate dielectric. The apparatus includes a sense transistor which includes a drain region within the substrate and a gate overlying a portion of the second well region. The second well region is configured as a source for the sense transistor. The apparatus includes an anti-fuse memory device which includes a contact region within the second well region and a gate electrode overlying the gate dielectric. The gate electrode also overlies a portion of the contact region. The contact region is characterized by the second conductivity type and has a higher conductivity than the well region.

In a specific embodiment, the first conductivity type is P-type and the second conductivity type is N-type. In an alternative embodiment, the first conductivity type is N-type, the second conductivity type is P-type, and the first supply voltage is lower than the second supply voltage. In an embodiment the well region is characterized by a depth of more than 1 um. In another embodiment the well region is characterized by a depth of more than 0.5 um. In a specific embodiment, the predetermined voltage is higher than a breakdown voltage of the gate dielectric. In an embodiment, the predetermined voltage is about 10-15 volts.

In yet another embodiment, the invention provides a method for making an integrated circuit device. The method includes providing a semiconductor substrate having a surface region. The substrate is characterized by a first conductivity type. The method includes forming three well regions within the semiconductor substrate. The first well region is characterized by a second conductivity type. The second well region is characterized by the second conductivity type. A junction between the second well region and the substrate is characterized by a breakdown voltage higher than a predetermined voltage. The third well region being characterized by the first conductivity type. The method forms a plurality of isolation regions. The method also forms a gate dielectric layer overlying the surface region overlying the first, second, and third well regions. The method includes depositing a polysilicon layer and patterning the polysilicon layer to form a first, second, third, and fourth gate electrodes. The first gate electrode overlies a first portion of the gate dielectric overlying the third well. The second gate electrode overlies a second portion of the gate dielectric overlying the first well region. The third gate electrode overlies a third portion of the gate dielectric overlying a portion of the substrate and a portion of the second well region. The fourth gate electrode overlies a fourth portion of the gate dielectric overlying the second well region. The method further includes selectively implanting impurities of the first conductivity type into the first well region using the second gate electrode as a mask to form a source region and a drain region of a first transistor. The method also selectively implants impurities of the second conductivity type to simultaneously form a source region and a drain region of a second transistor, a drain region of a sense transistor, and a contact region of an anti-fuse memory device.

In a specific embodiment, the first conductivity type is P-type and the second conductivity type is N-type. In an alternative embodiment, the first conductivity type is N-type, the second conductivity type is P-type, and the first supply voltage is lower than the second supply voltage. In an embodiment the well region is characterized by a depth of more than 1 um. In another embodiment the well region is characterized by a depth of more than 0.5 um. In a specific embodiment, the predetermined voltage is higher than a breakdown voltage of the gate dielectric. In an embodiment, the predetermined voltage is about 10-15 volts.

Embodiments of the present invention provide many benefits over conventional techniques. For example, a specific embodiment of the invention provides an easy to use process that relies upon conventional technology. In some embodiments, the invention provides a process for fabricating an anti-fuse device integrated with a sense transistor that is compatible with conventional process technology without substantial modifications to conventional equipment and processes. In an embodiment, the invention provides a method for programming an anti-fuse nonvolatile memory without on-chip high voltage circuit and does not need additional equipment such as a laser writer. Depending upon the embodiment, one or more of these benefits may be achieved. These and other benefits will be described in more throughout the present specification and more particularly below.

Various additional embodiments, features and advantages of the present invention can be more fully appreciated with reference to the detailed description and accompanying drawings that follow.

BRIEF DESCRIPTION OF THE DRAWINGS

The accompanying drawings, which are incorporated herein and form a part of the specification, illustrate the present invention and, together with the description, further serve to explain embodiments of the invention.

DETAILED DESCRIPTION OF THE INVENTION

Embodiments of the present invention provide techniques for fabricating integrated circuit devices. More particularly, embodiments of the present invention provide a method and structure for an anti-fuse based non-volatile memory device. Merely by way of example, the present invention provides a method and device for an anti-fuse based programmable serial number generating device using conventional CMOS logic process. But it would be recognized that the invention has a much broader range of applicability.

Depending upon the embodiment, the present invention includes various features, which may be used. These features include the following:

1. Anti-fuse device fabricated in conventional CMOS process with no additional process steps.

2. Formation of a sense transistor integrated with an anti-fuse device.

3. A method for programming an anti-fuse nonvolatile memory that does not need on-chip high voltage circuits and does not require specialized programming equipment, such as a laser writer.

As shown, the above features may be in one or more of the embodiments to follow. These features are merely examples, which should not unduly limit the scope of the claims herein. One of ordinary skill in the art would recognize many variations, modifications, and alternatives.

Figure 1:
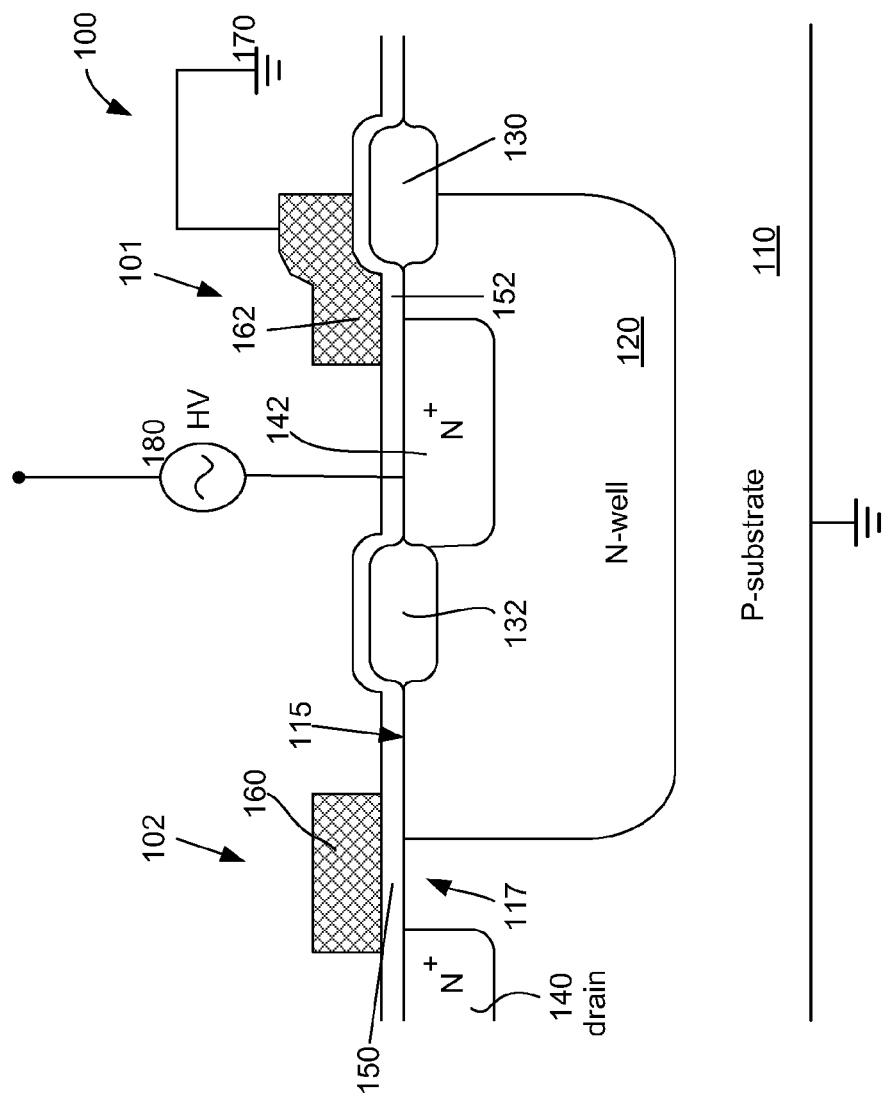
FIG. 1 is a simplified cross-sectional view diagram of an anti-fuse based serial number device according to an embodiment of the present invention.

FIG. 1 is a simplified cross-sectional view diagram of an anti-fuse based memory device 100 according to an embodiment of the present invention. This diagram is merely an example, which should not unduly limit the scope of the claims herein. One of ordinary skill in the art would recognize many variations, alternatives, and modifications. As shown, memory device 100 includes a P-type substrate 110, which includes a surface region 115. An N-type well region 120 is formed within the P-type substrate 110. In some embodiments memory device 100 also includes isolation regions 130 and 132, which can be LOCOS type isolation regions or shallow trench isolation regions, etc. The device also includes a first N+ region 140 formed within the P-type substrate 110 and a second N+ region 142 formed in N-well 120. N+ regions 140 and 142 are heavily doped with N-type impurities such as arsenic or phosphorus. In certain embodiments, the N+ region may have a dopant concentration of about 5E18 to 5E19/cm$^3$, and dopant concentration in an N-well may be 1.0E15 to 5.0E16/cm$^3$. In some embodiments, N+ regions 140 and 142 have higher conductivity than the N-well region 120. As will be discussed below, N+ region 142 is used as a contact region to receive a voltage supply for programming the anti-fuse memory device. Memory device 100 also includes a thin gate dielectric layer (e.g., gate oxide, nitride, silicon oxynitride) overlying the surface region 115, which extends over the P-type substrate region and the N-well region as shown. Device 100 further includes a first polysilicon gate 160 and a second polysilicon gate 162 formed over the gate dielectric layer. In FIG. 1, the gate dielectric layer under polysilicon gate 160 is labeled 150, and the gate dielectric layer under polysilicon gate 162 is labeled 152. Depending upon the embodiment, one of ordinary skill in the art would recognize other variations, modifications, and alternatives.

According to an embodiment of the invention, memory device 100 includes an anti-fuse device 101 and a sense transistor 102. Referring to FIG. 1, anti-fuse device 101 includes the second N+ region 142 as a contact region, gate dielectric layer 152, and polysilicon gate 162. Sense transistor 102 includes the first polysilicon gate 160, gate dielectric layer 150, the first N+ region as a drain, P-substrate region 117 as a channel, and N-well region 120 as a source. Anti-fuse device 101 can be programmed by providing a voltage to the first N+ region 142, while connecting polysilicon gate 162 to a ground terminal 170. In an embodiment, the voltage can be supplied, for example, by a high voltage source 180 supplying a high voltage pulse, which is selected to cause a breakdown of gate dielectric 152 and form a short circuit between N+ region 142 and polysilicon region 162. The state of the anti-fuse device can be read out by applying a bias voltage to the gate 160 of the sense transistor. The threshold voltage of the sense transistor 102 is determined by a threshold voltage adjustment implant in substrate region 117. If the dielectric 152 in the anti-fuse device 101 has been broken down, the sense transistor source region 120 is electrically connected to ground terminal 170 through N+ contact region 142 and polysilicon layer 162. In this case, if the sense amplifier is turned on, its drain region 140 will be at a voltage close to ground potential 170. If, on the other hand, anti-fuse dielectric 152 is not broken down, then source region 120 of the sense transistor will be electrically floating, and the drain region 140 will be at a potential higher than the ground potential.

As discussed earlier, a high voltage is involved during anti-fuse programming to break down a gate dielectric. For example, gate dielectrics often break down at an electric field of about 10-15 MV/cm. For a 10 nm thick gate dielectric, the breakdown voltage can be about 10-15 volts. Therefore, voltage source 180 is selected to supply a voltage higher than 10-15 volts. In some embodiments, terminal 170 can be connected to a voltage other than the ground potential. In this case, voltage source 180 will be selected to provide an even higher voltage. According to embodiments of the invention, anti-fuse device 101 is configured to operate under high voltage conditions. The high voltage 180 applied to N+ contact region 142 during anti-fuse programming is distributed across a junction region formed by N-well 120 and P-type substrate 110. Since N-well region 120 is lightly doped, the junction region has a high breakdown voltage. The depth and doping concentration of N-well region 120 are selected to have a junction breakdown voltage higher than a breakdown voltage of the gate dielectric in the anti-fuse device 101. N-well 120 is also used as a source region for the sense transistor 102, allowing the sense transistor to be integrated with the anti-fuse device. Depending upon the embodiment, one of ordinary skill in the art would recognize other variations, modifications, and alternatives. For example, a lightly doped drain (LDD) structure and spacers can be formed for sense transistor polysilicon gate 160. In an alternative embodiment, anti-fuse memory device 100 can be formed by reversing the conductivity of each region from N-type to P-type, and vice versa. For example, a PMOS transistor can be formed with a P+ region and a P-well within an N-type substrate. A P+ contact region within the P-well can be used to form an anti-fuse device. In this case, the voltage supplies are chosen to apply a lower voltage at the P+ contact relative to the gate of the anti-fuse device.

Figure 2:
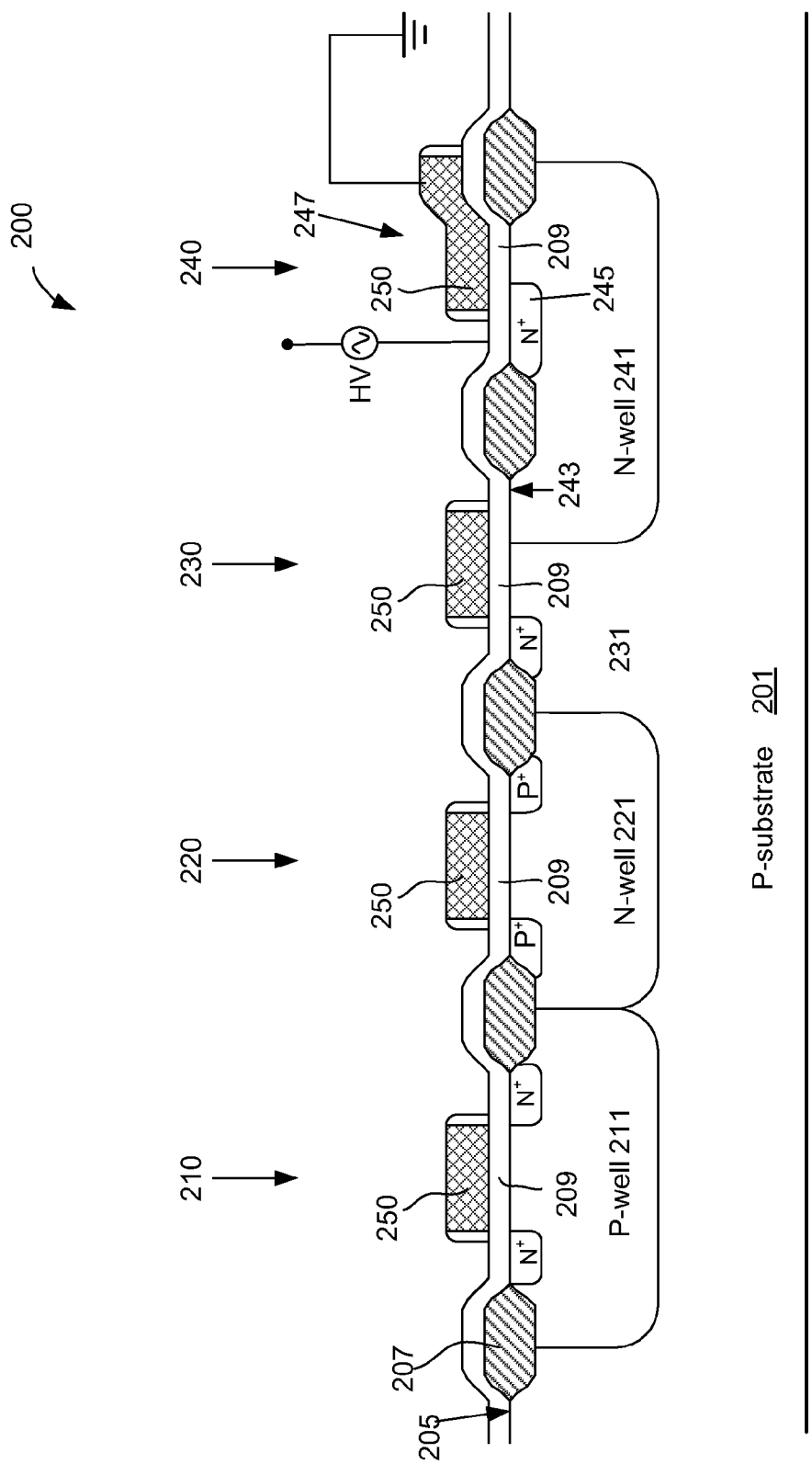
FIG. 2 is a simplified cross-sectional view diagram of an integrated circuit device according to an embodiment of the present invention.

The anti-fuse memory device 100 as described above with reference to FIG. 1 can be fabricated using a conventional CMOS logic process. FIG. 2 is a simplified cross-sectional view diagram of a CMOS integrated circuit device 200 including an anti-fuse device according to an embodiment of the present invention. This diagram is merely an example, which should not unduly limit the scope of the claims herein. One of ordinary skill in the art would recognize many variations, alternatives, and modifications. As shown, the device 200 includes NMOS region 211, PMOS region 221, anti-fuse sense transistor region 231, and anti-fuse device region 241. Various features of CMOS IC device 200 will be addressed in the discussion below.

Figure 3:
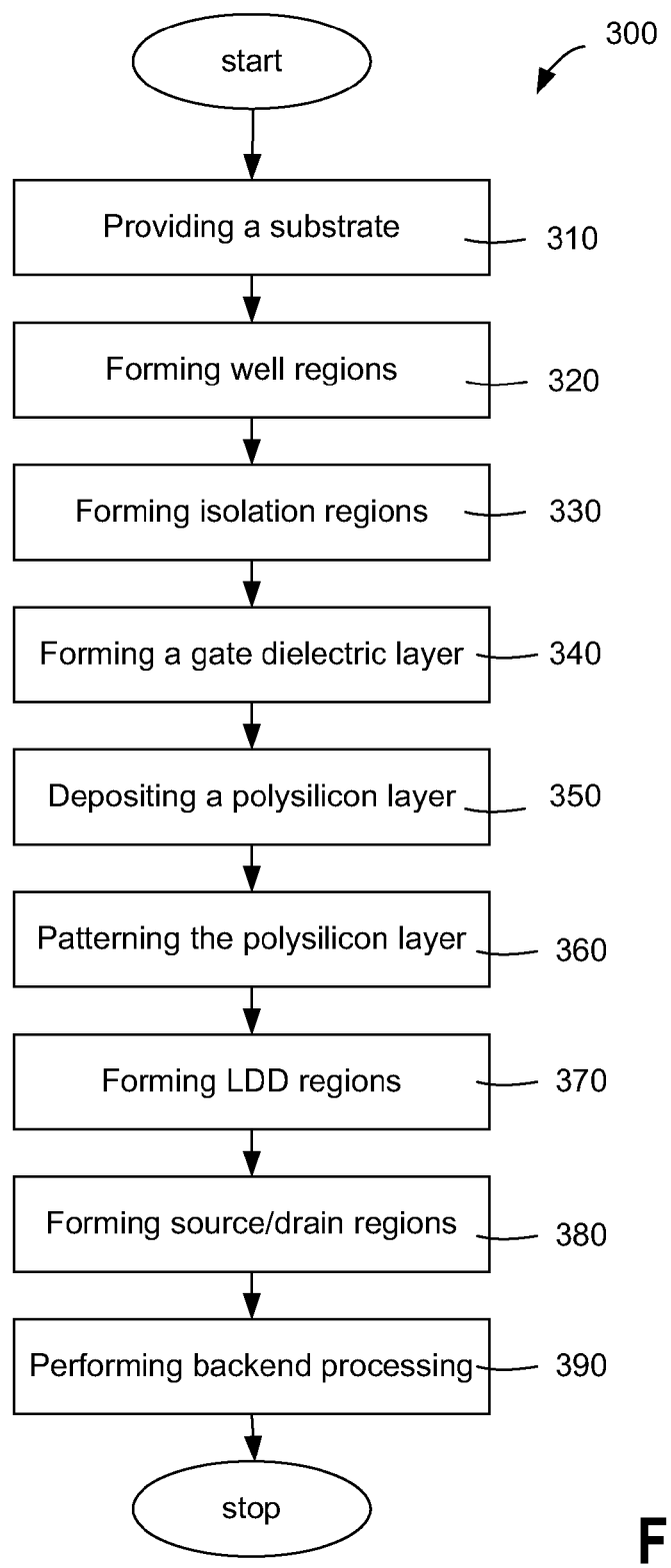
FIG. 3 is a simplified flowchart of a method for making an integrated circuit device according to an embodiment of the present invention.

FIG. 3 is a simplified flowchart diagram for a method for fabricating an integrated circuit device according to an embodiment of the present invention. This diagram is merely an example, which should not unduly limit the scope of the claims herein. One of ordinary skill in the art would recognize many variations, alternatives, and modifications. The method may be outlined as follows:

1. Provide substrate, e.g., silicon wafer (310);
2. Form well regions including a P-well region, and a first and second N-well regions (320);
3. Form isolation regions (330);
4. Form a gate dielectric layer (340);
5. Deposit a polysilicon layer for logic transistor gates and anti-fuse device electrode (350);

6. Pattern exposed polysilicon layer to form logic transistor gates and anti-fuse device ground plate and expose regions of the substrate for ion implantation into the source and drain regions (360);

7. Form lightly doped drain regions (370);

8. Form the source and drain of the logic transistors and anti-fuse sense transistor, as well as the high voltage electrode of the anti-fuse device (380); and 9. Backend process, dielectrics, metal, contacts, etc. (390).

The above sequence of steps provides a method according to an embodiment of the present invention. As shown, the method uses a combination of steps including a way of forming an anti-fuse non-volatile memory device according to embodiments of the present invention. Other alternatives can also be provided where steps are added, one or more steps are removed, or one or more steps are provided in a different sequence without departing from the scope of the claims herein. Further details of the present method can be found throughout the present specification and more particularly below.

A method for fabricating an integrated circuit device according to an embodiment of the present invention may be described in more detail with reference to the simplified cross-sectional diagram in FIG. 2 and the simplified flowchart diagram in FIG. 3. These diagrams are merely examples, which should not unduly limit the scope of the claims herein. In an embodiment, the method uses conventional CMOS logic process to fabricate an integrated circuit that includes an NMOS transistor, a PMOS transistor, an anti-fuse sense transistor, and an anti-fuse device. As shown in FIG. 2, the method includes (process 310 in FIG. 3) providing a substrate, e.g., silicon wafer 201 that includes a surface region 205. The method includes (process 320) forming adequate well structures within the substrate. The well structures include a P-well region 211 for an NMOS transistor, an N-well region 221 for a PMOS transistor, and a second N-well region 241 for an anti-fuse device. The P-well region 211 includes boron based impurities, and the N-well regions 221 and 241 include N-type dopants such as phosphorus or arsenic based impurities. N-well regions 221 and 241 can be formed in the same process step. As discussed earlier, the depth and dopant concentration of N-well are selected to provide a high junction breakdown voltage. In process 330, isolation regions such as 207 (e.g., shallow trench isolation) are formed for devices isolation. Threshold voltage adjustment implants are now performed, usually separately for the P-well region and N-well region, to provide desirable threshold voltages for the NMOS and PMOS transistors. In some embodiments, sense transistor region 231 can also receive the NMOS threshold voltage adjustment implant. The method includes (process 340) forming a gate dielectric layer 209 (e.g., gate oxide, nitride, silicon oxynitride) overlying the surface region, which extends over the well regions as also shown. The gate oxide is often formed using a thermal oxidation process to form high quality gate oxide, which is substantially free from voids. Proper gate dielectric layer thicknesses are often required for devices to operate at different voltages. Depending upon the embodiment, there can be other variations, modifications, and alternatives.

Referring to FIGS. 2 and 3, the method also includes (process 350) depositing polysilicon film 250 overlying the gate dielectric layer 209. In certain embodiments, the polysilicon film is preferably used to form gates for logic transistors 210 and 220 and a gate for anti-fuse sense transistor 230, as well as an electrode for the anti-fuse device 240 in the anti fuse device region. The polysilicon film is often doped using impurities to provide conductive characteristics. The film can be doped using diffusion and/or in-situ doping techniques of phosphorus bearing impurities, e.g., phosphine. The film can be a single layer or multiple layers of different materials, depending upon the embodiment. The polysilicon film 250 is then patterned (process 360) to form gates for NMOS, PMOS, anti-fuse sense transistor, and a gate electrode for the anti-fuse device. In an embodiment, an edge of the polysilicon gate for sense transistor 230 is positioned to overlap N-well region 241. Here a purpose of this overlap is to enable N-well region 241 to function as a source region for the sense transistor. In some embodiments, a portion of the polysilicon gate for the anti-fuse device 240 is positioned to overlap an isolation structure. As will be described in further detail below, a contact will be made to the anti-fuse polysilicon gate electrode. Such a contact is preferably made on a portion of the polysilicon overlying an isolation dielectric instead of a thin gate dielectric.

In a specific embodiment, the method includes (process 370) forming lightly doped drain ("LDD") structures (not shown) for each of the transistors, as shown in FIG. 2. Photoresist masks are used to implant N-type impurities into NMOS region 211 and sense transistor region 231, and to implant P-type impurities into PMOS region 221. In some embodiments, the LDD implant can have an implant dose of impurities ranging from about 1E13 atoms/cm$^2$ to about 5E13 atoms/cm$^2$ according to preferred embodiments. In process 380, after LDD implant, a dielectric layer (e.g., oxide) is deposited and etched back to form a spacer 252. After spacer formation, logic transistor source/drain (S/D) formation processes are performed. Here photoresist masking steps are used to implant N-type impurities into NMOS region 211 and sense transistor region 231, and to implant P-type impurities into PMOS region 221. The source/drain implant can have a implant dose ranging from about 3E15 atoms/cm$^2$ to about 5E15 atoms/cm$^2$ according to preferred embodiments. In some embodiments, a photoresist mask is used to prevent N+ source implant into a region marked 243 in FIG. 2 in N-well region 241 adjacent to the sense transistor gate. A junction breakdown voltage can be lowered at a junction between N-well 241 and P-type substrate 201, if an N+ region is in proximity of the junction. Of course, one of ordinary skill in the art would recognize other variations, modifications, and alternatives.

In process 390, typical backend processes are performed. The method includes forming interlayer dielectrics, contacting layers, contact and via structures (not shown in FIG. 2). In an embodiment, a contact is provide over N+ contact region 245 in the anti-fuse region 240 to facilitate the application of a high voltage for programming. As discussed earlier, a contact is formed on a portion of the anti-fuse device polysilicon gate electrode 247 that is over an isolation region. This contact is used to connect polysilicon layer 247 to ground, or another voltage supply during anti-fuse programming. Of course, one of ordinary skill in the art would recognize other variations, modifications, and alternatives.

The anti-fuse devices as shown in FIG. 1 can store one bit of binary data. In order to store information of a multiple-bit serial number, an embodiment of the invention provides a plurality of anti-fuse devices such as shown in FIG. 1. A subset of these anti-fuse devices are selected and programmed. The programmed and unprogrammed anti-fuse devices are used to represent a serial number. An external high voltage source can be used for programming. Alternatively, on-chip high voltage charge pump circuits can be used to generate voltages necessary for programming. To access the programmed serial number, a gate voltage applied to the sense transistor enables the reading of the potential at the anti-fuse device. Depending upon the embodiment, one of ordinary skill in the art would recognize other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. An integrated circuit apparatus, comprising:
a semiconductor substrate, the substrate being characterized by a first conductivity type;
a well region within the semiconductor substrate, the well region being characterized by a second conductivity type, a junction between the well region and the substrate being characterized by a breakdown voltage higher than a predetermined voltage;
a plurality of isolation regions;
a contact region within the well region, the contact region being characterized by the second conductivity type, the contact region being configured to receive a first supply voltage;
a channel region within the substrate;
a drain region, the drain region being characterized by the second conductivity type, the drain region being separated from the well region by the channel region;
a gate dielectric layer overlying the channel region and the contact region;
a first polysilicon gate overlying the gate dielectric layer which overlies the channel region, an edge of the first polysilicon gate overlying a portion of the well region, the first polysilicon gate, the drain region, and the well region being associated with a gate region, a drain region, and a source region, respectively, of an MOS transistor; and
a second polysilicon gate overlying the gate dielectric layer which overlies the contact region, the second polysilicon gate being configured to receive a second supply voltage.

2. The apparatus of claim 1, wherein the first conductivity type is P-type and the second conductivity type is N-type.

3. The apparatus of claim 1, wherein the first conductivity type is N-type and the second conductivity type is P-type, and wherein the first supply voltage is higher than the second supply voltage.

4. The apparatus of claim 1, wherein the well region is characterized by a depth of more than 1 um.

5. The apparatus of claim 1, wherein the well region is characterized by a depth of more than 0.5 um.

6. The apparatus of claim 1, wherein the predetermined voltage is higher than a breakdown voltage of the gate dielectric.

7. The apparatus of claim 1, wherein the predetermined voltage is about 10-15 volts.

8. The apparatus of claim 1, wherein a voltage difference between the first supply voltage and the second supply voltage is greater than a breakdown voltage of the gate dielectric layer.

9. An integrated circuit apparatus, the apparatus comprising:
a semiconductor substrate comprising a surface region, the substrate being characterized by a first conductivity type;
a first well region within the semiconductor substrate, the first well region being characterized by a second conductivity type;
a second well region within the semiconductor substrate, the second well region being characterized by the second conductivity type, a junction between the second well region and the substrate being characterized by a breakdown voltage higher than a predetermined voltage;
a third well region within the semiconductor substrate, the third well region being characterized by the first conductivity type;
a plurality of isolation regions;
a gate dielectric layer overlying the surface region overlying the substrate, the first well region, second well region, and the third well region;
first MOS transistor comprising a drain region and a source region within the third well region, the first transistor further comprising a first gate overlying the gate dielectric;
second MOS transistor comprising a drain region and a source region within the first well region, the second MOS transistor further comprising a second gate overlying the gate dielectric;
a sense transistor comprising a drain region within the substrate and a gate overlying a portion of the second well region, the second well region being configured as a source for the sense transistor; and
an anti-fuse memory device comprising a contact region within the second well region, the contact region being characterized by the second conductivity type, the contact region being also characterized by a higher conductivity than the well region, the anti-fuse memory device further comprising a gate electrode overlying the gate dielectric, the gate electrode also overlying a portion of the contact region.

10. The apparatus of claim 9, wherein the first conductivity type is P-type and the second conductivity type is N-type.

11. The apparatus of claim 9, wherein the first conductivity type is N-type and the second conductivity type is P-type.

12. The apparatus of claim 9, wherein the second well region is characterized by a depth of more than 1 um.

13. The apparatus of claim 9, wherein the predetermined voltage is higher than a breakdown voltage of the gate dielectric.

14. The apparatus of claim 9, wherein the predetermined voltage is about 10-15 volts.

* * * * *